United States Patent [19]
Gionis et al.

[11] 3,938,109
[45] Feb. 10, 1976

[54] HIGH SPEED ECL COMPATIBLE MOS-RAM

[75] Inventors: John Gionis, Sunnyvale; Mark S. Ebel, Santa Clara; William M. Regitz, Cupertino, all of Calif.

[73] Assignee: Intel Corporation, Santa Clara, Calif.

[22] Filed: Feb. 19, 1975

[21] Appl. No.: 551,001

[52] U.S. Cl........ 340/173 R; 307/203; 340/173 DR
[51] Int. Cl.² ...................... G11C 7/06; G11C 8/00
[58] Field of Search .................. 340/173 R, 173 DR; 307/203

[56] References Cited
UNITED STATES PATENTS
3,778,784  12/1973  Karp et al. .................... 340/173 R

OTHER PUBLICATIONS
Geilhufe, More bits/chip leads to economical semiconductor memory systems, EDN, 2/20/73, pp. 76–81.

Primary Examiner—Stuart N. Hecker
Attorney, Agent, or Firm—Spensley, Horn & Lubitz

[57] ABSTRACT

A metal-oxide-silicon (MOS), random-access memory (RAM) which is emitter-coupled logic (ECL) compatible and which does not require any high level clock inputs. The memory utilizes pseudo-static cells which are refreshed with an asynchronous charge-pump signal generated on the memory chip. Buffers utilize the ECL reference signal to assure ECL compatibility. The memory employs dynamic decoding in two separate levels of decoding.

16 Claims, 7 Drawing Figures

CHARGE PUMP

Fig. 6

CHARGE PUMP WAVEFORM

HIGH SPEED ECL COMPATIBLE MOS-RAM

BACKGROUND OF THE INVENTION

1. Field of the Invention

The invention relates to the field of ECL compatible MOS memories.

2. Prior Art

Since the early 1960's emitter-coupled logic (ECL) has become an accepted logic form particularly associated with high speed circuit operation. In the early 1970's with the introduction of ECL-10,000 circuitry, some of the earlier problems associated with ECL, such as high cost and design difficulties, generally have been overcome.

While in recent years MOS circuits, such as memories, have been fabricated which are TTL compatible, only minor inroads have been made in achieving an MOS memory which is ECL compatible. Among the problems associated with the fabrication and design of such a memory is the fact that the ECL signals are at best only a few tenths of a volt higher than the ECL reference signal. These small voltage swings are not compatible with the higher level signals associated with either n-channel or p-channel MOS circuitry.

The presently disclosed random-access memory (RAM) provides ECL compatibility, and unlike other memories does not require any high level clock input signals. Moreover, the memory appears to be static to the user since refreshing is accomplished with an asynchronous charge-pump signal generated on the memory chip.

SUMMARY OF THE INVENTION

A metal-oxide-silicon, random-access memory which is compatible with emitter-coupled logic and which is deployed on a single substrate is disclosed. A plurality of memory cells for storing information are coupled to a plurality of sensing means for sensing the stored information. A plurality of timing signal generators for generating timing signals are coupled to the memory cells and to the sensing means. A plurality of the input buffers for receiving input signals to the memory are utilized; each of the buffers has at least two input terminals, one for receiving a reference signal and the other for receiving an input signal. Each of these buffers includes circuit means for adjusting the sensitivity of the buffer to the input signal as a function of the magnitude of the reference signal. This circuit may be used with external emitter-coupled logic circuitry because the small differential signals can thus readily be detected.

BRIEF DESCRIPTION OF THE DRAWINGS

FIG. 7 also illustrates the input chip enable signal applied to the memory.

DETAILED DESCRIPTION OF THE INVENTION

A random-access memory (RAM) fabricated utilizing metal-oxide-silicon (MOS) technology which is emitter-coupled logic (ECL) compatible is described. As will be appreciated, many of the specific details disclosed herein such as the number of bits, particular fabrication techniques and many other details are presented to give a better understanding of the presently preferred embodiment of the invention not to limit the scope of the invented memory.

In the presently preferred embodiment the ECL compatible memory is disposed on a single silicon substrate or chip of approximately 204 × 237 mils. The memory stores 4,096 bits in an array having 64 pairs of column lines (bit lines) and 64 row lines. The transistors used in the memory all comprise n-channel, enhancement mode, field-effect transistors employing polycrystalline silicon gates. In the presently preferred embodiment access times of less than 80 nanoseconds have been obtained. Typical operation power is approximately 500 milliwatts and standby power consumption is approximately 300 milliwatts.

All the inputs to the memory such as the address inputs, data input and chip enable signal (CE), are ECL signals. The memory does not require any high level ($V_{DD}$) inputs. The power inputs to the memory are $V_{DD}$ (15 volts), $V_{SS}$ (0 volts) and $V_{BB}$ (−5.2 volts). This latter potential which is used both for substrate biasing, and in some of the circuitry of the memory, is the ECL power supply voltage. In the presently preferred embodiment the memory is compatible with ECL III and ECL-10,000 logic forms. The output of the memory which includes data and data, is compatible with ECL circuitry.

Figure 1:
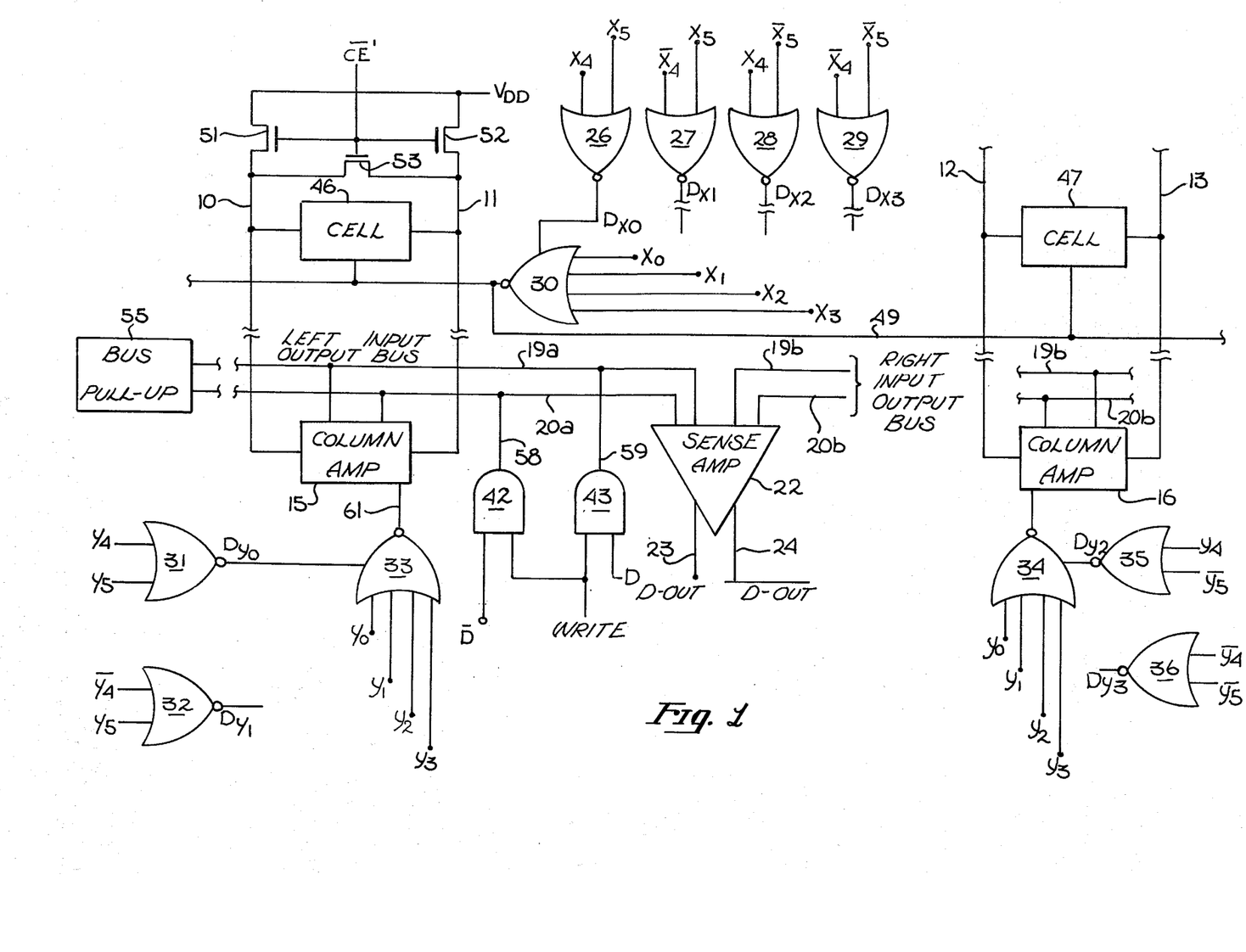
FIG. 1 is a partial block diagram illustrating the general layout of the memory and the two levels of decoding utilized in the memory.

Referring first to FIG. 1, information of data is stored in binary form within a plurality of cells such as cells 46 and 47. Each cell includes a four-transistor dynamic crosscoupled circuit. The data is stored in the form of a charge on parasitic capacitance primarily defined by the gate of one of the transistors. Information is read into the cell, and out of the cell, on a pair of column lines such as column lines 10 and 11 coupled to cell 46, and lines 12 and 13 coupled to cell 47. The cell is in the form of a bistable circuit and one of the pair of column lines coupled to the cell senses data while the other senses data. The cells in the presently preferred embodiment are refreshed through charge pumping. This type of refreshing is often referred to as "transparent" refreshing since the cells appear to be static from the user's standpoint.

Figure 5:
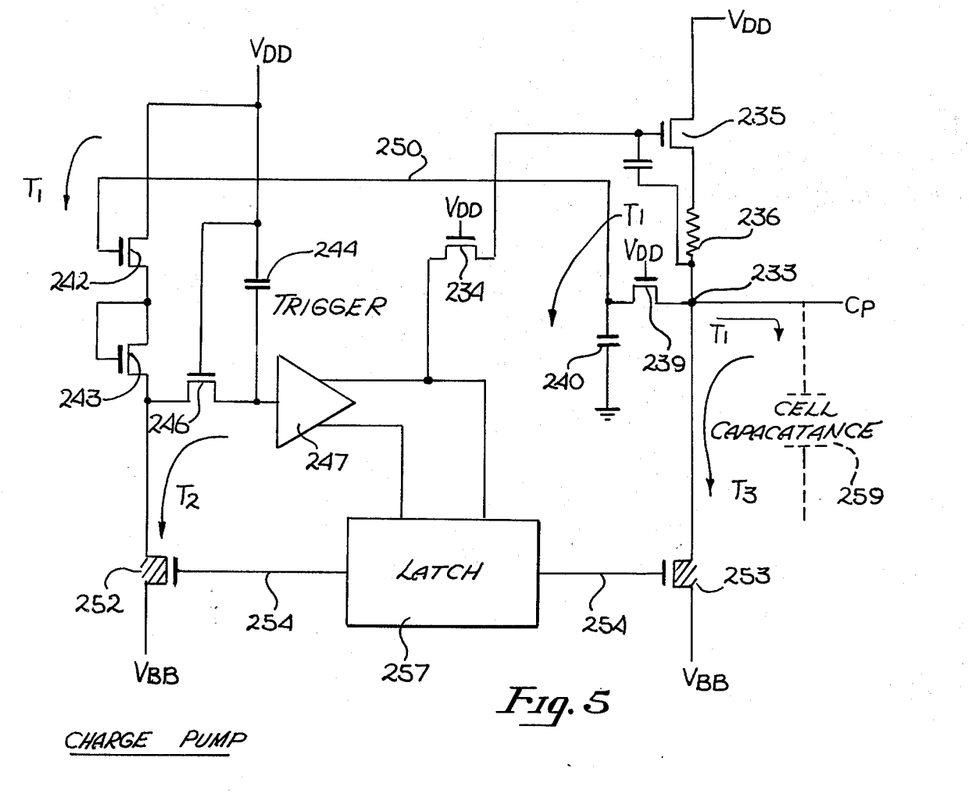
FIG. 5 is a circuit diagram of the charge-pump generator utilized for refreshing the memory cells in the memory.
Figure 6:
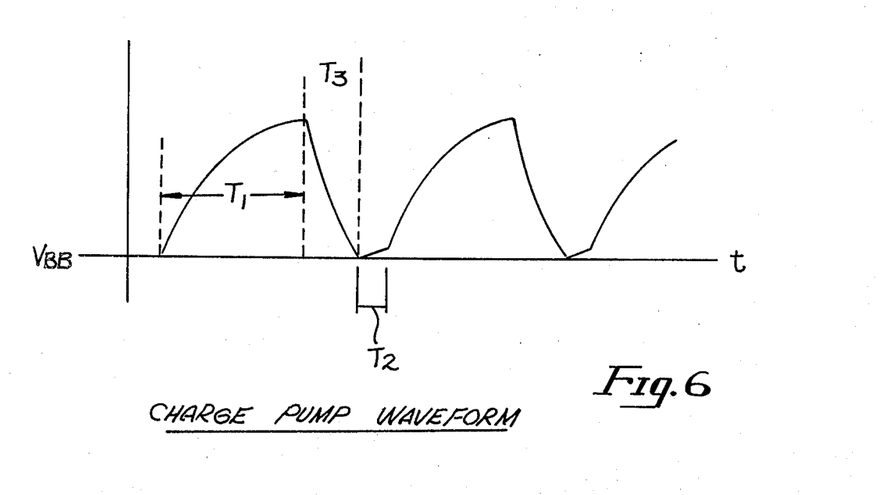
FIG. 6 is a graph illustrating the output waveform of the charge-pump generator of FIG. 5.

Typically in the prior art refreshing through charge pumping has required the use of a signal which drops below the substrate potential. For this reason the charge pumping signal is not generated on the substrate or chip which includes the memory, and hence must be externally generated and applied to the memory. The charge pumping techniques used in the presently preferred embodiment are described in copending application Ser. No. 473,668, filed May 28, 1974, entitled "Charge Pump Device for Integrated Circuit." (This copending application is assigned to the assignee of the present application.) In the presently preferred embodiment the charge pump generator which is shown in detail in FIG. 5, is disposed on the same substrate with the remainder of the memory and is a free running oscillator, that is, it is asynchronous with the remainder of the memory. The details of this charge pump generator and its waveform which is shown in FIG. 6, will be discussed, subsequently, in conjunction with these figures.

Referring again to FIG. 1, the memory includes a plurality of parallel pairs of column lines such as lines 10 and 11 and lines 12 and 13. Transverse to these column lines are a plurality of row lines such as row line 49. In the presently preferred embodiment the pairs of column lines are evenly divided into two spaced apart groups with decoding circuitry and the sense amplifier 22 being disposed generally between these two groups of spaced apart lines. In FIG. 1 only one pair of lines 10 and 11 are shown disposed to the left of the decoder clock generators or first level row decoders 26, 27, 28, 29 and 30 and sense amplifier 22, and only a single pair of column lines 12 and 13 are shown generally disposed to the right of the same row decoders and the sense amplifier. Each cell is connected to a pair of column lines and to a single row line, for example, cell 46 is coupled to column lines 10 and 11 and to row line 49 while cell 47 is coupled to column lines 12 and 13 and to row line 49. The connection between each of the cells and the charge pump generator is not shown in order not to overcomplicate the drawing.

Figure 7:
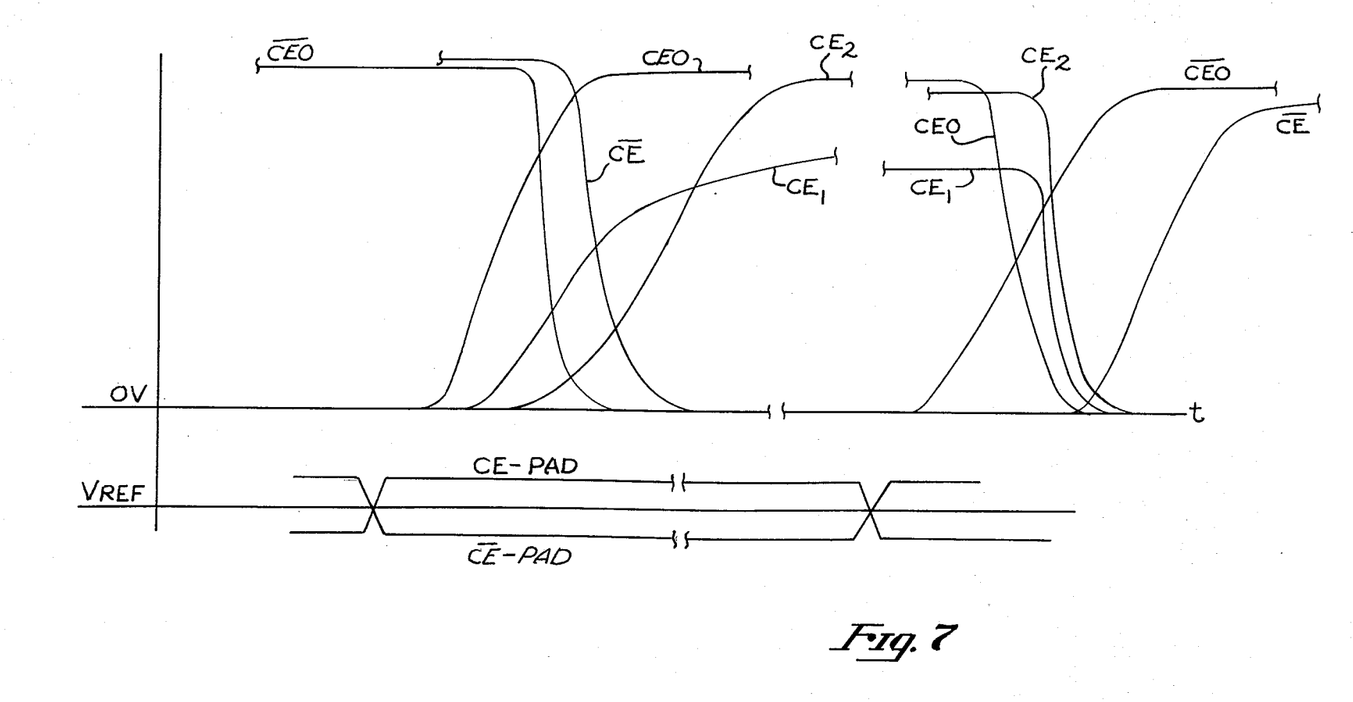
FIG. 7 is a graph illustrating various clock signals which are generated within the memory and utilized by the memory.

Other portions of the memory not shown in FIG. 1 but which are coupled to the circuit illustrated in FIG. 1 include the address buffers which are coupled to the decoders shown in FIG. 1, the various timing generators which generate the waveforms shown in FIG. 7, the charge pump generator previously mentioned, and various buffers such as the chip enable buffer. The address buffers and chip enable buffer will subsequently be discussed in detail. The various timing signals shown in FIG. 7 may be generated utilizing known circuitry. These signals are generated within the memory (on the chip) from the CEO and $\overline{CEO}$ signal. The generation of these latter signals will be discussed in conjunction with FIG. 2.

The specific circuitry and logic associated with the write function and the read-modified-write functions are not shown, known circuitry along with buffers disclosed in this application may be utilized for these functions. In the presently preferred embodiment in order to provide a read-modified-write function the write buffer is not externally clocked. A differential data input with respect to the ECL reference signal is used to fire a Schmitt trigger to generate the write enable clock.

Again referring to FIG. 1, each pair of column lines terminates at one end in a column amplifier; for example lines 10 and 11 terminate in column amplifier 15 and lines 12 and 13 terminate in column amplifier 16. The other cells disposed along each of these pair of column lines would likewise be coupled to column amplifiers 15 and 16. The other ends of each pair of column lines terminate in a circuit utilized for precharging or pulling-up column lines and for equalizing the potential between the column lines. One such circuit is shown coupled to lines 10 and 11 and includes transistors 51 and 52 coupled between lines 10 and 11 and V and equalizing transistor 53 coupled between lines 10 and 11. The gates of transistors 51, 52 and 53 are all coupled to the source of the $\overline{CE}'$ signal. As is known in the art, for dynamic cells, such as cell 46, the column lines or bit lines are charged prior to the time that information is read from the cell. This charging is accomplished by transistors 51 and 52 from the V potential during "dead time", this time generally being the time when the chip enable (CE) signal is in its low state indicating that the memory or chip is not selected. Specifically, the column lines 10 and 11 and the other column lines in the array are charged during the period of time that the $\overline{CE}'$ signal is positive. Note that the $\overline{CE}'$ signal is not shown in FIG. 7 but that this signal, in the presently preferred embodiment, is generated from the $\overline{CEO}$ signal and $CE_2$ signal, and that the signal generally follows the $\overline{CE}$ signal, but is delayed from that signal.

A single pair of bidirectional data bus lines 19 and 20 are coupled to all the column amplifiers in the array. These lines are generally bisected by the sense amplifier 22 as shown in FIG. 1. Lines 19a and 20a extend to the left of the sense amplifier and are coupled to the column amplifiers in the left portion of the array such as amplifier 15, while lines 19b and 20b are coupled to those column amplifiers which are in the right portion of the array such as column amplifier 16. These bidirectional data bus lines are used both for sensing information in the array and for writing information into the array. A bus pull-up circuit such as bus pull-up circuit 55, is coupled to these lines and is used for precharging these lines during the period of time that CE is positive.

A pair of AND gates 42 and 43 are coupled to lines 20a and 19a, via lines 58 and 59, respectively, for the purpose of writing information into the array. An identical pair of gates are coupled to lines 19b and 20b although not shown in FIG. 1. These gates receive the data input signal and its converse, $\overline{data}$. As is apparent upon receipt by gate 43 of the appropriate write signal, data and $\overline{data}$ signals are applied to the bidirectional data bus lines 19a and 20a and the selected cell is programmed through a column amplifier.

Referring to FIG. 1, the first level decoders used in the memory are illustrated along with three second level decoders 30, 33 and 34. Four first level row decoders 26, 27, 28 and 29 are each used for selecting a group of row lines. Similarly, as will be explained, the first level column decoders 31, 32, 35 and 36 are each used for selecting a group of columns.

The memory receives a 12 bit address, six bits of which are used for selecting a row, and the remaining six bits for selecting a column. The row address is designated $X_0$ through $X_5$ while the column address is designated $X_0$ through $X_5$. Each bit of the address is applied to an address buffer such as the one shown in FIG. 3, the output of the buffers which includes the address and its complement, are then applied to the various decoders in the array as indicated in FIG. 1. The first level decoder and second level decoders associated with a selected cell would receive all zeroes. Note that the first level and second level decoders are NOR gates.

Referring first to the first level row decoders, NOR gate decoder 26 receives the $X_4$ and $X_5$ signal, NOR gate decoder 27 receives the $\overline{X}_4$ signal and $X_5$ signal, NOR gate decoder 28 receives the $X_4$ and $\overline{X}_5$ signals and NOR gate decoder 29 receives the $X_4$ and $\overline{X}_5$ signals. The output of these gates, respectively, is the $D_{x0}$ signal, $D_{x1}$ signal, $D_{x2}$ signal and $D_{x3}$ signal. It is apparent that a signal will appear at the output of one and only one of the decoders 26, 27, 28 and 29 for each address applied to the memory. In the presently preferred embodiment the first level decoders operate as clock generators for clocking the second level decoders.

The output of gate 26 is coupled to a plurality of second level decoders such as NOR gate decoder 30. In the presently preferred embodiment decoder 26 is coupled to 16 second level row decoders, such as decoder 30, and in a similar manner, decoders 27, 28 and 29 are each used to activate 16 second level row decoders. Thus for each address received by the memory, 16 second level row decoders will be activated by one of the signals $D_{X0}$, $D_{X1}$, $D_{X2}$ or $D_{X3}$.

The second level row decoder, NOR gate decoder 30 receives the inputs $X_0$, $X_1$, $X_2$ and $X_3$ and also the input $D_{X0}$. The output of this NOR gate is used to activate a single row line in the array, line 49. The remaining second level row decoders coupled to decoder 26 each receive a different combination of the address signals $X_0$, $X_1$, $X_2$ and $X_3$ and their complements. Similarly, each of the other first level decoders are each coupled to decoders which receive the $X_0$, $X_1$, $X_2$ and $X_3$ signals and their complements. It should be noted that one advantage to using both first level and second level decoders as shown in FIG. 1 is that the decoders are simplified, and only 16 of 64 X and Y decoders may be selected at any one time thus minimizing power dissipation.

Figure 4:
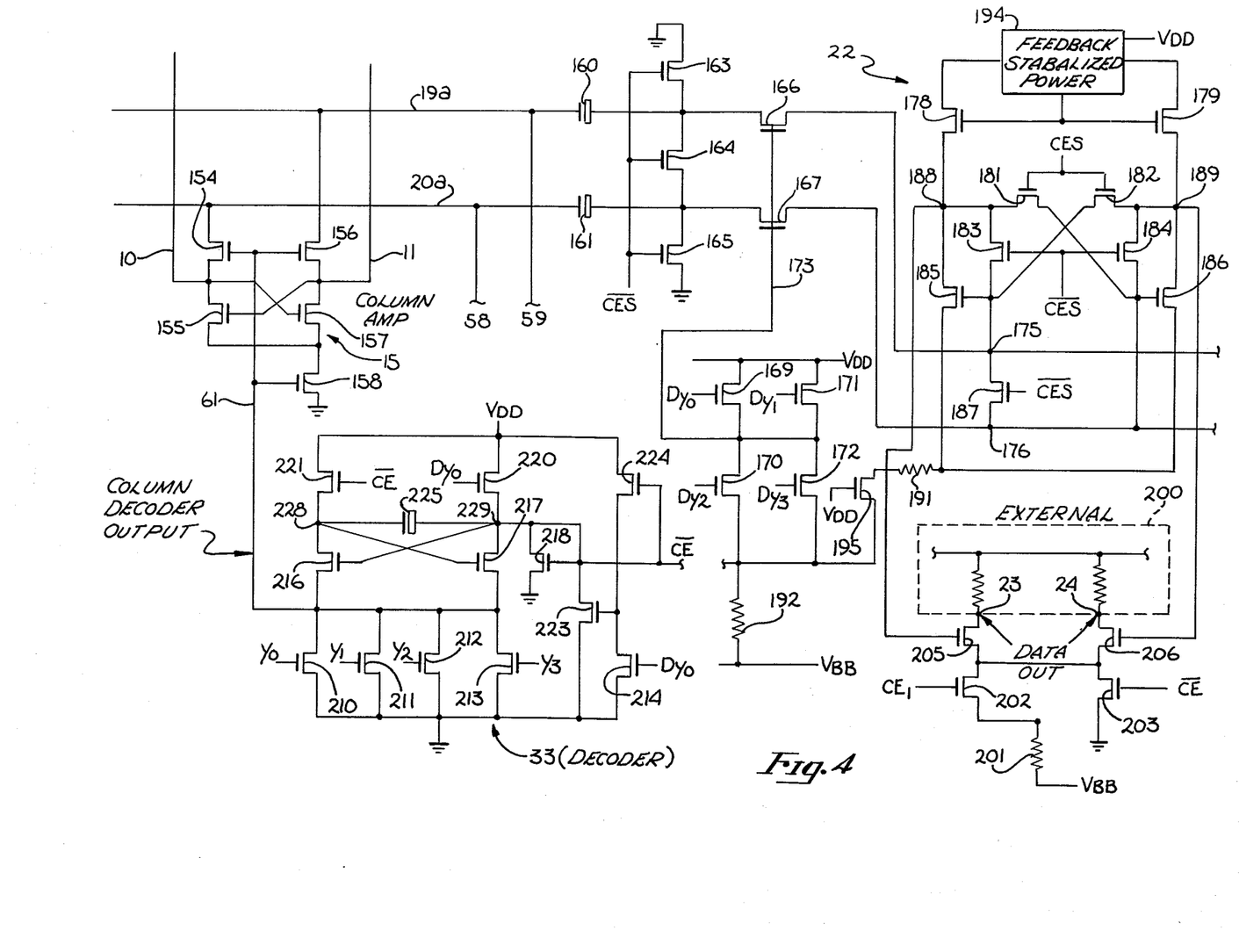
FIG. 4 is a circuit diagram illustrating a column amplifier, a decoder and the sense amplifier utilized in the memory.

The column selection is performed in a similar fashion to the row selection and each of the first level column decoders, NOR gate decoders 31, 32, 35 and 36 each receive a different combination of the address signals $Y_4$ and $Y_5$ and their complements. The output from each of these NOR gates is applied to a different group of second level column decoders each group comprising 16 decoders. For example, the output of NOR gate decoder 31, $D_{Y0}$ is applied to the second level decoder 33. The output from this NOR gate, line 61, is used to activate the column amplifier 15. The input to decoder 33 comprises the address signals $Y_0$ through $Y_3$. A detail circuit diagram of NOR gate decoder 33 is shown in FIG. 4.

As was the case for the row decoders, each group of second level column decoders coupled to a first level column decoder receives a different combination of the address signals $Y_0$ through $Y_3$ and their complements. By way of example, the output from decoder 35, $D_{Y2}$ is coupled to second level decoder 34. The output from decoder 35 is coupled to a total of 16 second level column decoders and each one of these decoders receives a different combination of the signals Y through Y and their complements.

In the presently preferred embodiment the output from decoders 31 and 32, the $D_{Y0}$ and $D_{Y1}$ signals, respectively, are used to activate second level decoders coupled to column amplifiers which are disposed on the left side of the array. The outputs from the decoders 35 and 36, the $D_{Y2}$ and $D_{Y3}$ respectively, are used to activate second level decoders which are coupled to column amplifiers disposed on the right side of the array. As will be seen, the output from decoders 31, 32, 35 and 36 is used by other circuitry shown in FIG. 4. This other circuitry couples either lines 19a and 20a or lines 19b and 20b to sense amplifier 22.

As is apparent for each address received by the memory, one, and only one, first level row decoder will activate a group of second level row decoders; and one, and only one, first level column decoder will activate a group of second level column decoders. Also, for each address received, one second level row and column decoder in each of the four groups will receive its correct address. However, only one second level row decoder and column decoder in the array will be activated for any address.

It will be apparent, by way of example, that two first level row decoders could have been used, each for selecting one of two groups of 32 second level row decoders in the 64 × 64 memory described. Other combinations of first level and second level decoders for both rows and columns may be utilized.

Figure 2:
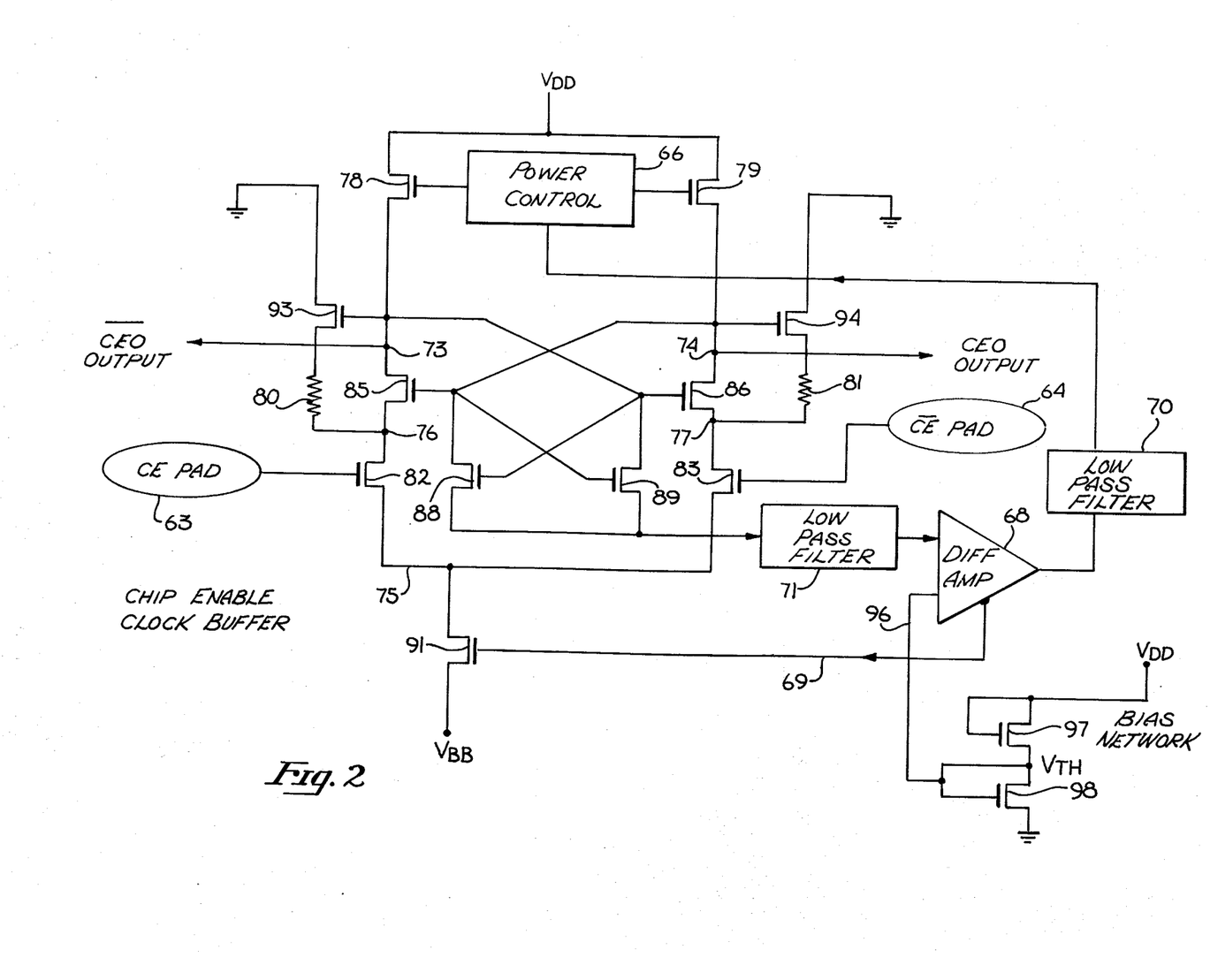
FIG. 2 is a circuit diagram of the chip enable clock buffer utilized in the memory.

Referring to FIG. 2, the chip enable clock buffer receives external inputs identified as CE pad 63 and $\overline{CE}$ pad 64. The output of the buffer is $\overline{CEO}$, node 73 and CEO, node 74. The input waveform applied to pad 63 is shown in FIG. 7 along with the two output waveforms CEO and $\overline{CEO}$. Unlike the remainder of the buffers used in the memory, both the chip enable and its complement are utilized to generate the output from the chip enable clock buffer. As will be seen, the remainder of the buffers in the memory utilize an input signal and the ECL reference voltage and not an input signal and its complement. In the case of the chip enable clock buffer, both the chip enable and its complement are utilized in order to maximize the differential input and to obtain rapid rise times (and decay times) at the output signals of this buffer. It should be noted that the outputs from this buffer as previously mentioned are utilized to generate the other clocking signals utilized in the memory including those shown in FIG. 7.

Referring to FIG. 2, the chip enable clock buffer is a high gain latched differential amplifier coupled between the sources of potential $V_{DD}$ and $V_{BB}$, this latter potential being the same as the ECL power supply potential. The amplifier utilizes a DC stabilizing loop which includes amplifier 68 for maintaining stability. A pair of load transistors 78 and 79 are coupled to a power control means 66. The power control means 66 regulates the potential on the gates of transistors 78 and 79 to compensate for fluctuations in $V_{DD}$ and chip-to-chip variations in threshold. The power control means 66 is controlled by the output of the differential amplifier 68 and is coupled to that amplifier by line 69.

The source of transistor 78 is coupled to the gate of transistor 93 and the drain of feedback transistor 85. This common junction, node 73, is also coupled to the drain of transistor 89 and the gates of transistors 86 and 88. Likewise, the source of transistor 79 is coupled to the drain of transistor 86 at node 74. Node 74 is also common with the gate of transistor 94, the gates of transistors 85 and 89 and the drain of transistor 88. Both transistors 88 and 89 have their source terminal coupled to a low pass filter 71. These transistors, as will be seen, act as an OR gate in providing a signal to the low pass filter 71. Transistor 93 is coupled from node 76 through resistor 80 to ground potential ($V_{SS}$) and provides a current path from ground to node 76. In a similar manner transistor 94 is coupled from node 77 through resistor 81 to ground potential, and likewise, provides a path from ground potential to node 77.

The input sensing transistor 82 senses the input chip enable signal on its gate and is coupled between nodes 76 and 75. The input sensing transistor 83 has its gate coupled to the complement of the chip enbable signal and is coupled between node 77 and 75. Transistor 91 which acts as a current source is coupled between node 75 and $V_{BB}$.

The differential amplifier 68 which may be constructed from known circuitry, senses two inputs and provides a differential output at its output terminal and on line 69. The output from ampliofier 68 is coupled to the power control means 66 through a low pass filter 70. The output on line 69 controls the potential on the gate of transistor 91, and hence the current flow from node 75 to the potential $V_{BB}$. One input to the differential amplifier 68 is the output of the low pass filter 71, the other input to amplifier 68, line 96, is a potential representative of a threshold of a field-effect transistor disposed on the substrate with the remainder of the memory. This potential is generated by the series combination of transistors 97 and 98 which are coupled between $V_{DD}$ and ground. The gate of transistor 97 is coupled to $V_{DD}$ potential, while the gate of transistor 98 is coupled to line 96.

The power control means 66, the low pas filters 70 and 71 and the differential amplifier 68 may be fabricated utilizing known circuitry.

In examining the operation of the chip enable clock buffer, assume first that the chip enable signal is in its low state, that is, the chip is not selected. During this period of time the potential applied to the gate of transistor 83 is greater than the potential applied to the gate of transistor 82, and more current flows through the path comprising transistors 79, 86 and 83 than through the path comprising transistor 78, 85 and 82. During this period (dead time) the drain of transistor 82, node 76, is held at a potential of approximately −0.3 volts. This occurs because the gate of transistor 93 is above ground potential and the drain of transistor 93 is at ground. Thus, a current path exists through transistors 93, 82 and 91 to $V_{BB}$. The gate of transistor 85, node 74, is held at a potential of approximately +0.6 volts, this node being common with the drain of transistor 86. This balance is maintained through the differential amplifier 68 since its output is a function of the threshold voltage of transistor 98 and the potential sensed at the sources of transistors 88 and 89. This output (line 69) controls the current through transistor 91, and hence the potential on node 74 and also controls the loads 78 and 79. The differential amplifier 68 compensates for variations in threshold potential and variations in power supply potentials. The low pass filters 70 and 71 filter out the switching transients and other high frequency signals to assure smooth outputs from the buffer.

When the chip enable signal applied to the gate of transistor 82 becomes positive, and the signal applied to the gate of transistor 83 becomes more negative, current through transistor 82 increases as current through transistor 83 decreases. This change in current changes the balance between the two current paths coupled between $V_{DD}$ and node 75 and particularly causes node 76 to become more negative and nodes 74 and 77 to become more positive. Because of the feedback from node 74 to transistor 85, and the feedback from node 73 to transistor 86, the output at these nodes switches and latches as shown by the waveforms for the CEO and $\overline{CEO}$ signals in FIG. 7. After this transition node 77 as was the case with node 76 prior to the transition is maintained at a potential of approximately −0.3 volts by the current path through transistor 94, thus "setting up" transistor 83 to sense the transition of the externally applied $\overline{CE}$ signal from its low state to its high state while transistor 82 senses the transistor of the externally applied CE signal from its high state to its low state. By carefully maintaining the potential on nodes 76 and 77, transistors 82 and 83 are set particularly to sense the transition from a low state to a high state; as mentioned, this transition of the input ECL signal only varies a few tenths of a volt.

Figure 3:
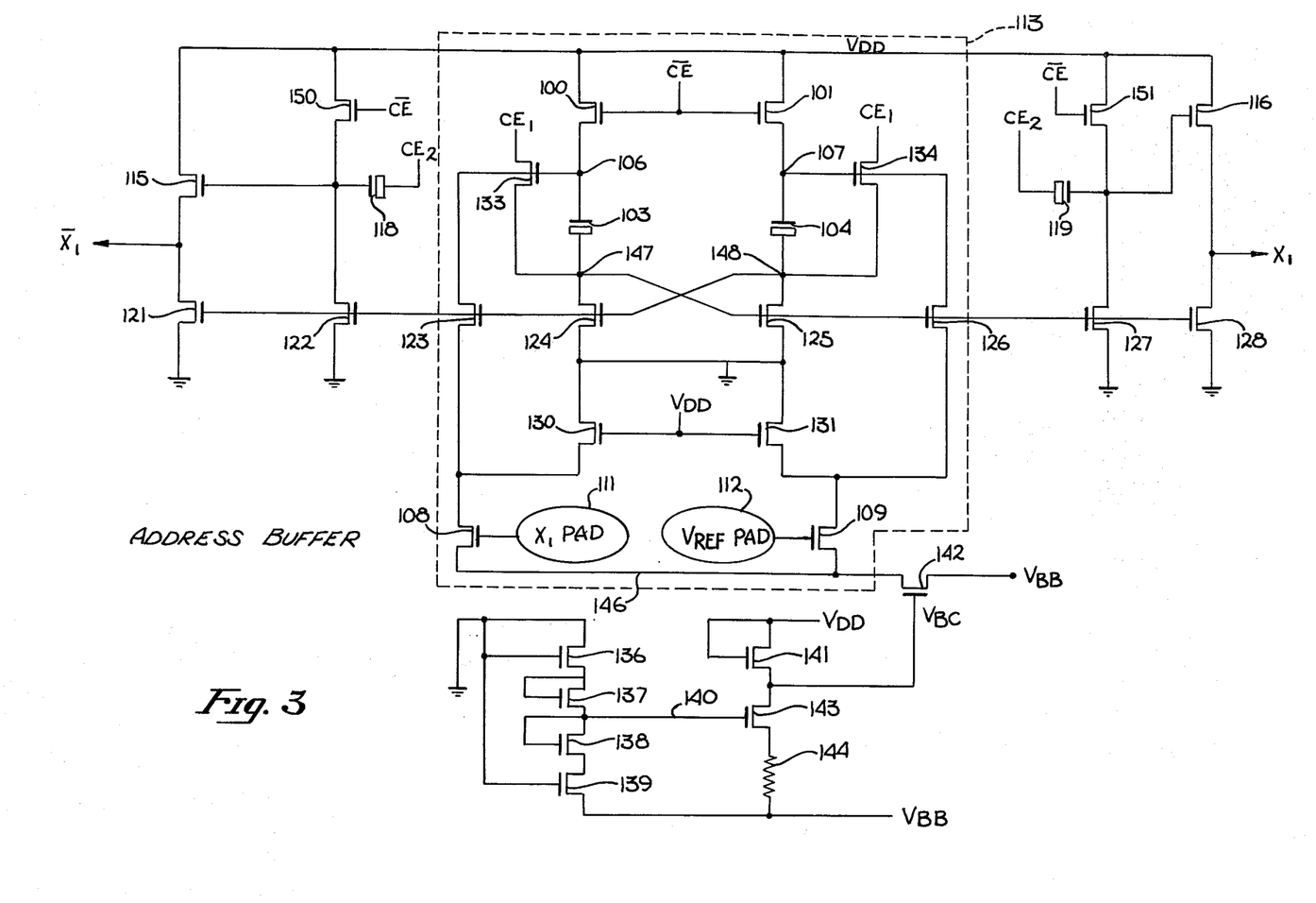
FIG. 3 is a circuit diagram illustrating an address buffer utilized in the memory.

Referring to FIG. 3, the address the buffer shown therein receives two external signals one identified as $X_1$; pad 111 and $V_{ref}$, pad 112. The output from the buffer includes the $\overline{X}_1$ signal shown at the source of the output transistor 115 and the $X_1$ signal shown at the source of the output transistor 116. The buffer of FIG. 3 is a dynamic circuit which utilizes the $\overline{CE}$ signal, the $CE_1$ signal and the $CE_2$ signal, these signals being shown in FIG. 7. Note that the $\overline{CE}$ signal shown in FIG. 3 is not the same signal as the externally applied chip enable signal, but rather is a high level signal generated on the chip from the CEO and $\overline{CEO}$ signal. In the drawings and specification in order to differentiate between the input signals appplied from external sources to the memory and those generated within the memory the word "pad" has been added to those signals applied to the memory or chip from external sources.

The buffer of FIG. 3 includes a buffer latch circuit shown generally within the dotted line 111, and a pair of output buffers, one for providing the $X_1$ signal and the other for providing the $\overline{X}_1$ signal. A controlled bias potential $V_{BC}$ is applied to the gate of transistor 142 as will be discussed. This potential is generated by transistors 136 through 139 and transistors 141 and 143. In the presently preferred embodiment an address buffer such as shown in FIG. 3 is utilized for the address signals $X_0$ through $X_3$ and $Y_0$ through $Y_3$. For those address signals which are applied to the first level of decoders, that is $X_4, X_5, Y_4$ and $Y_5$, a buffer latch, such as buffer latch 111, is utilized without the output buffers. The reason for this is that in the present design the $X_4$, $X_5, Y_4$ and $Y_5$ signals are applied to transistors (in the decoders) which are coupled to a precharged node, and to permit precharging of these nodes, output buffer signals are required which either remain in their low states or become positive.

Referring first to the latch buffer 113 portion of the address buffer of FIG. 3, it comprises a generally bistable circuit having two parallel branches disposed between $V_{DD}$ and node 146. The sensing transistor 108 is disposed in one of these branches, its gate being coupled to the $X_1$ pad 111. In the other branch the sensing transistor 109 has its gate coupled to the $V_{ref}$ pad 112. The common source node 146 is coupled to the $V_{BB}$ potential through transistor 142. Feedback between the branches of the latch is provided from node 148 to transistor 124, and from node 147 to transistor 125. One branch includes transistor 100, which has its drain coupled to $V_{DD}$ and its source coupled to node 106 and one terminal of capacitor 103. In the other branch in a similar manner transistor 101 is coupled between $V_{DD}$ and node 107, node 107 being common with one terminal of capacitor 104. Capacitor 103 has its other terminal, node 147, coupled to the source of transistor 133 and to the drain of transistor 124. In a similar manner, the other terminal of capacitor 104 is coupled to node 148 and to the source of transistor 134. Both transistors 133 anad 134 have their drains coupled to the source of the $CE_1$ signal. Both transistors 124 and 125 have their sources coupled to ground. A feedback path exists between the gate of transistor 124 and node 148, and between the gate of transistor 125 and node 147.

Node 106 is coupled to the gate of transistor 133 and is coupled to the sensing transistor 108 through transistor 123. In a similar manner node 107 is coupled to the gate of transistor 134 and through transistor 126 is coupled to the sensing transistor 109. The load transistor 130 has its source terminal coupled to the drain terminal of transistor 108, and similarly, transistor 131 of the other branch of the latch circuit has its source terminal coupled to the drain terminal of transistor 109. It should be noted that transistors 130 and 131 have their drains coupled to ground potential, but through the sensing transistors and transistor 142 are coupled to a negative potential, $V_{BB}$.

The gate of transistor 142 is coupled between the common junction of the series combination of transistors 141 and 143. The source of transistor 143 is coupled to the $V_{BB}$ potential through resistor 144 while the gate and drain of transistor 141 are coupled to $V_{DD}$. Transistors 136, 137, 138 and 139 have their source and drain terminals coupled in series between ground and the $V_{BB}$ potential. The gate of transistor 136 is coupled to ground potential as is the gate of transistor 139. The gate of transistor 137 is coupled to the common junction formed between transistors 136 and 137; the gate of transistor 138 is coupled to the common junction between transistors 137 and 138 and to the gate of transistor 140.

Each of the outer buffers of the address buffer includes a bootstrap circuit and an output stage. The $\overline{X}_1$ output of the buffer of FIG. 3 includes a bootstrap circuit comprising transistors 150 and 122 coupled in series between $V_{DD}$ and ground. The common junction between these two transistors is coupled to the source of the $CE_2$ potential through capacitor 118. The gate of transistor 150 is coupled to the source of the $\overline{CE}$ potential and the gate of transistor 122 is common with the gate of transistors 121, 123, 124 and with node 148. The output transistor 115 is coupled in series with transistor 121, this series combination being coupled between the $V_{DD}$ potential and ground. The gate of transistor 115 is coupled to the common node between transistors 150 and 122.

In a similar fashion transistors 151 and 127 are coupled in series between $V_{DD}$ and ground, these transistors provide a bootstrap potential along with capacitor 119 to the gate of the output transistor 116. The output transistor is in series with transistor 128 between $V_{DD}$ and ground. The $X_1$ output signal is taken from the common junction formed between these transistors.

The buffer of FIG. 3, in addition to being utilized as an address buffer in the presently preferred embodiment is also utilized as a data-in buffer and may be utilized for receiving other signals communicated to a memory where ECL compatibility is required.

The operation of the buffer of FIG. 3 will first be examined during the period of time that the chip is not enabled. During this dead time the $\overline{CE}$ signal is positive, thus transistors 100 and 101 will conduct, thereby charging nodes 106 and 107 to $V_{DD}$ less a threshold. Additionally, transistors 150 and 151 are also conducting, thereby charging the bootstrap capacitor 118 and 119, respectively, and the outputs $X_1$ and $\overline{X}_1$ to $V_{DD}$ less two thresholds. Since the $CE_1$ signal is at ground potential during this period of time, nodes 147 and 148 are of substantially at ground potential and thus transistors 121, 122, 123, 124, 125, 126, 127 and 128 are not conducting.

When the $CE_1$ signal becomes positive both transistors 133 and 134 will begin to conduct, note that their gates are coupled to the previously charged nodes 106 and 107, respectively. When this occurs both nodes 147 and 148 will rise in potential. This in turn will cause transistors 123 and 126 to begin to conduct since the drains of these transistors are coupled to the precharged nodes 106 and 107 and furthermore, since their gates are coupled to nodes 148 and 147, respectively. Assume first that the potential applied to the $X_1$ pad 111 is greater than the $V_{ref}$ pad potential indicating that the $X_1$ address signal is a binary one. (In the presently preferred embodiment the address is assumed valid when the chip enable signal becomes positive.) This will cause transistor 108 to conduct more heavily than transistor 109. The conduction of transistor 108 will bring the source of transistor 123 lower, particularly because of the conduction path from ground through transistor 130, transistor 108 and transistor 142 which terminates in the $V_{BB}$ potential. The greater conduction of transistor 123, in turn causes node 106 to discharge more quickly than node 107. As node 106 discharges transistor 133 ceases to conduct, while node 147 drops to ground potential because node 148 is increasing in potential thereby causing transistor 124 to conduct. The capacitors 103 and 104 aid in quickening this transition and provide bootstrapping. As the latch circuit is set node 147 drops to ground potential, node 147 drops to ground potential, and node 148 approaches the $V_{DD}$ potential since transistor 134 is conducting.

The positive potential on node 148 causes transistors 121 and 122 to conduct. The conduction of transistor 122 prevents the gate of the output transistor 115 from becoming positive, hence preventing transistor 115 from conducting, while the positive potential on the gate of transistor 121 discharges the $\overline{X}_1$ output line to ground. On the other side of the address buffer, since node 147 is at ground potential, transistors 127 and 128 do not conduct. When the $CE_2$ signal becomes positive (note from FIG. 7 that this signal becomes positive after the $CE_1$ signal becomes positive) the gate of the output transistor 116 is bootstrapped through capacitor 119 causing transistor 116 to heavily conduct. Since transistor 128 is not conducting, the $X_1$ line is coupled to the $V_{DD}$ potential.

In a similar manner, if the signal applied to the $X_1$ pad 111 had been lower in potential than the $V_{ref}$ pad signal, then transistor 115 would conduct thereby producing the appropriate output signals from the address buffer.

The $V_{BC}$ signal is generated to compensate for process and power supply variations and accomplishes this compensation by controlling the current through transistor 142. This compensation prevents premature conduction of transistors 123 and 126. The $V_{BC}$ level is controlled primarily relative to the $V_{BB}$ potential so as to maintain a substantially constant current drive in transistors 142 and the equivalent transistor in the other buffers. Node 140 of the $V_{BC}$ generator is fixed at a potential of approximately two thresholds negative relative to $V_{SS}$. These thresholds are specifically transistors 136 and 137. By way of example, if the $V_{BB}$ potential becomes more positive, since this potential is coupled to the source of transistor 142 both the gate to source and drain to source potentials of transistor 142 are reduced. However, the same reduction in gate to source potential of transistor 143 causes thee $V_{BC}$ potential to increase. Because of the gain factor resulting from transistors 141 and 143 the increase of the $V_{BC}$ potential compensates for the reduction in $V_{BB}$ potential. Similarly, if $V_{BB}$ becomes more negative, the $V_{BC}$ potential is reduced sufficiently to compensate for the increased current in transistor 142.

Referring to FIG. 4, a portion of the memory illustrated in FIG. 3 is shown in greater detail. The column amplifier 15 of FIG. 1 is illustrated in more detail along with the pair of the column lines 10 and 11 which terminate in the column amplifier 15. The column amplifier 15 of FIG. 1 is again illustrated coupled through line 61 to the second level decoder 33 in FIG. 4. The bidirectional data bus lines 19a and 20a are also illustrated in FIG. 4 coupled to sense amplifier 22. The lines 58 and 59 used for writing information into the cells disposed on the left side of the array are again illustrated in FIG. 4. The data output lines 23 and 24 of FIG. 1 are illustrated in FIG. 4 coupled to transistors 205 and 206, respectively. A logic newtwork comprising transistors 169, 170, 171 and 172 is illustrated in FIG. 4. This network and corresponding network disposed on lines 19b and 20b (FIG. 1) are used to gate information into a sense amplifier from either the right side of the array or the left side of the array.

Referring to FIG. 4, the column amplifier 15 includes transistors 154 and 155 which are coupled in series between line 20a and the drain of transistor 158, and transistors 156 and 157 which are coupled in series between line 19a and the drain of transistor 158. These two series paths form a generally bistable cicuit due to the positive feedback from the common junction between transistors 156 and 157 to the gate of transistor 155, and the positive feedback from the common junction between transistors 154 and 155 to the gate of transistor 157. The sources of transistors 155 and 157 are coupled to ground through transistor 158. The gates of transistors 154, 156 and 158 are coupled to line 61 and are activated by the decoder circuit.

As previously indicated, both the bidirectional data bus lines 19a and 20a are charged along with the column lines, such as column lines 10 and 11. When a cell has been selected and is coupled to the column lines, the binary data stored in the cell will determine whether transistor 155 conducts more heavily than transistor 157 or whether transistor 157 conducts more heavily than transistor 155. This of course assumes that the decoder shown in FIG. 4 has been selected, that is, a positive signal exists on line 61. Depending upon the state of the cell, either line 19a or 20a is discharged while the other line remains positively charged.

The decoder 33 of FIG. 4 includes decoding transistors 210, 211, 212, 213 coupled between line 61 and ground. These transistors are coupled to the source of the $Y_0$, $Y_1$, $Y_2$ and $Y_3$ signals, respectively. (Equivalent transistors in the other decoders will be coupled to $\overline{Y}_0$, $\overline{Y}_1$, $\overline{Y}_2$ and $\overline{Y}_3$ and appropriate combinations.) The decoding transistor 214 is coupled to an output of a first level decoder (decoder 31 of FIG. 1) and receives the $D_{Y0}$ signal. This transistor is coupled between ground and both the gate of transistor 223 and the source of transistor 224. Transistors 221 and 216 are coupled in series between $V_{DD}$ and line 61, their common junction, node 228, is coupled to the gate of transistor 217. Transistors 220 and 217 are coupled in series between $V_{DD}$ and line 61; their common junction, node 229, is coupled to the gate of transistor 216. Nodes 228 and 229 are interconnected through capacitor 225. The gate of transistor 221 is coupled to the source of the $\overline{CE}$ signal, and the gate of transistor 220 is common with the gate of transistor 214 and receives the $D_{Y0}$ signal. (In the second level X-decoders the transistor 218 is not used.)

Node 229 is clamped to ground through transistor 218, during the period of time that the $\overline{CE}$ signal is positive. The gate of transistor 224 is also coupled to the source of the $\overline{CE}$ signal. This pullup transistor is utilized to precharge the gate of transistor 223. During the period of time that $\overline{CE}$ is positive capacitor 225 is charged since transistor 221 is conducting, and since node 229 is clamped to ground through transistors 218 and 223.

Assume that the decoder has been selected, when this occurs the signals $Y_0$ through $Y_3$ approach ground potential while the signal $D_{Y0}$ becomes positive. As the potential on node 229 begins to rise, since transistor 220 is conducting, node 228 is bootstrapped through capacitor 225. The boot-strapping of node 228 causes transistor 217 to conduct heavily. The potential on line 61 (this being the source of transistor 217) follows closely behind node 229. Since node 229 closely follows line 61 the gate to source potential of transistor 216 is maintained at less than a threshold. Thus, transistor 216 remains off. Note that the signal applied to transistor 214 discharges the gate of transistor 223 allowing node 229 to rise to potential. For successful operation of the decoder, it is important to maintain the drain to source potential across transistor 217 at less than a threshold, otherwise the detection will not be successful. It is necessary to minimize the resistance between line 61 and the source of transistor 216 in laying out the decoder since such resistance may introduce a delay causing transistor 216 to conduct. This in turn would prevent the bootstrapping of transistor 217 and result in the failure of the circuit.

If the decoder has not been selected, one or more of transistors 210, 211, 212 or 213 will conduct (assume that $D_{Y0}$ iis positive). In this case transistor 216 will conduct as the potential on node 229 rises since the source of transistor 216 is clamped to ground potential. This in turn causes the discharge of capacitor 225 and prevents transistor 217 from conducting. If on the other hand, the $D_{Y0}$ signal remains in its low state, also indicating that the decoder is not selected, the gate of transistor 223 which was previously charged remains charged since transistor 224 does not conduct. This clamps node 229 to ground along with the line 61 since the gate of transistor 217 remains coupled to the positively charged node 228.

The sense amplifier 22 of FIG. 1 is shown in detail in FIG. 4 as a single latch stage differential amplifier. The amplifier utilizes in addition to timing signals already discussed, a CES signal and a $\overline{CES}$ signal. Both of these timing signals are generated from the $CE_1$ signal and $CE_2$ signal, and are timing signals generally delayed from these latter two signals. Both the lower levels of the CES and $\overline{CES}$ signals drop below ground potential; the generator utilized to generate these signals is coupled between $V_{DD}$ and $V_{BB}$. As will be seen, this lower level signal is required in the sense amplifier because of the level shifting performed by the amplifier, this level shifting is necessary to assure ECL compatibility at the output of the amplifier.

The sense amplifier 22 is coupled to lines 19a and 20a through capacitors 160 and 161, respectively. Transistors 163 and 165 are coupled between one terminal 160 and 161, respectively and ground. Transistor 164 is coupled between the terminals of capacitors 160 and 161. Transistors 163, 164 and 165 have their gates coupled to the source of the $\overline{CES}$ potential. These transistors are utilized to assure that the input lines to the amplifier are equalized, and at ground potential before a signal is sensed.

Transfer transistors 166 and 167 are coupled into each of the input lines of the sense amplifier and are utilized to permit the transfer of a signal into the sense amplifier from the left side of the array. The gates of these transistors are coupled to line 173. Line 173 is coupled to $V_{DD}$ through the parallel combination of transistors 169 and 171, and to one terminal of resistor 192 through the parallel combination of transistors 170 and 172. The other terminal of resistor 192 is coupled to the $V_{BB}$ potential. Transistor 169 and 171 have their gates coupled to the sources of the $D_{Y0}$ signal and the $D_{Y1}$ signal, respectively. It is apparent that when either the $D_{Y0}$ signal or the $D_{Y1}$ signal are positive, transistors 166 and 167 will permit the sensing of a signal from lines 19a and 20a. Transistors 170 and 172 are coupled to the $D_{Y2}$ signal and $D_{Y3}$ signal, respectively. If either of these latter signals are positive, the gates of transistors 166 and 167 will be clamped to ground, and hence, the sense amplifier will be decoupled from lines 19a and 20a. It is apparent that transistors 169 170, 171 and 172 permit the sensing of information on lines 19a and 20a only when cell on the left side of the array has been selected. A similar logic circuit is utilized in conjunction with lines 19b and 20b to allow the sensing of information when a cell on the right side of the array has been selected. These logic circuits along with the transfer transistors are utilized to minimize the effects of the capacitance associated with the bidirectional data bus lines disposed on the unselected side of the array.

The sense amplifier includes a pair of input transistors 185 and 186 which are coupled in series to a pair of load transistors 178 and 179, respectively. The common node between transistor 185 and 178, node 188, is coupled to an output buffer, specifically the gate of transistor 205. Similarly, the common node 189 between transistors 186 and 179 is coupled to transistor 206. Both the drain terminals and the gate terminals of transistors 178 and 179 are coupled to a clocked feedback stabilized power supply 194. Supply 194 assures through a feedback loop (not shown) that a constant potential will be applied to transistors 178 and 179. This supply compensates for threshold and power supply variations. Known circuits may be utilized for supply 194.

The source terminals of both the transistors 185 and 186 are coupled through resistor 191, transistor 195, and resistor 192 to the $V_{BB}$ potential. The gate of transistor 185, node 175, is coupled to node 189 through transistor 182. The gate of transistor 186, node 176, is similarly coupled to node 188 through transistor 181. The gates of both transistors 181 and 182 are coupled to the source of the CES potential. The gate of transistor 185 is also coupled to node 188 through an equalizing transistor 183, and similarly the gate of transistor 186 is coupled to node 189 through equalizing transistor 184. The gates of transistors 183 and 184 are coupled to the source of the $\overline{CES}$ signal as is the gate of equalizing transistor 187. Equalizing transistor 187 is coupled between input nodes 175 and 176.

The data output buffer includes transistors 205 and 206 having their sources coupled to a common node. This node is coupled to $V_{BB}$ through transistor 202 and resistor 201 when CE is positive, and to ground ($V_{SS}$) through transistor 203 when $\overline{CE}$ is positive. The resistors coupled to lines 23 and 24 shown within dotted line 200 are external load resistors which may be coupled to a common bus as shown.

Prior to the time that the sense amplifier receives an input signal, assuming that the $\overline{CES}$ signal is positive, the bias level on transistors 185 and 186 is established by transistors 183 and 184, respectively, and the potential between nodes 175 and 176 is equalized by transistor 187. Assume that a signal is to be sensed on lines 19a and 20a and hence that transistors 166 and 167 are conducting, and further that the output of a column amplifier causes node 175 to rise in potential when compared to node 176. When the $\overline{CES}$ signal returns to its low state and the CES signal becomes positive, since node 175 is more positive than node 176, transistor 185 will conduct more heavily than transistor 186. This will cause node 188 to drop in potential more quickly than node 189. Since transistor 181 is conducting this greater drop in potential on node 188 will inhibit the conduction of transistor 186. As the potential on node 189 rises it causes transistor 185 to conduct more heavily. Thus, transistors 181 and 182 cause the sense amplifier to latch once a signal has been detected. The differential in potential between nodes 188 and 189 causes transistor 206 to conduct more heavily than transistor 205 and allows the sensing of data at lines 23 and 24. It is apparent that if node 176 had initially become more positive than node 175 the amplifier would have been latched in its other state.

The charge pump generator shown in FIG. 5 produces an output signal $C_p$ on node 233, this output signal being shown in FIG. 6. The periodic waveform of the $C_p$ signal includes a first period of time $T_1$ in which the $C_p$ signal rises to its maximum level, a second period of time identified as $T_3$ in which the waveform rapidly decays to the $V_{BB}$ potential and a third period of time identified as $T_2$ in which the output signal remains close to $V_{BB}$ potential. The charge pump generator is a free running oscillator which operates asynchronously.

The output signal on node 233 is coupled to $V_{DD}$ potential through a resistor 236 and an output transistor 235 and a bootstrap circuit. This bootstrap circuit includes transistor 234 which is coupled between the gate of transistor 235 and Schmitt trigger means 247 and a capacitor coupled between node 233 and the gate of transistor 235. Node 233 is coupled to the $V'_{BB}$ potential through transistor 253. This node is also coupled to node 250 through resistor 239. Node 250, which is common with the gate of transistor 242 is also coupled to ground through capacitor 240. Transistors 242, 243 and 252 are coupled in series between $V_{DD}$ and the $V_{BB}$ potential. The gate of transistor 243 is coupled to the common junction between transistors 242 and 243 while the common junction between transitors 243 and 252 is coupled to the input of a Schmitt trigger means 247 through a transistor 246. The input to the Schmitt trigger means 247 is coupled to the $V_{DD}$ potential through capacitor 244. The outputs of the Schmitt trigger means 247 are coupled to a bistable circuit, latch 257. The latch status line 254 is coupled to the gates of transistors 252 and 253. The Schmitt trigger means 247 and latch 257 may be fabricated from known designs. The channels of transistors 252 and 253 are ion implanted to shift the thresholds of these transistors in order that the latch status signals on lines 254 and 255 are able to cut off these transistors.

Assume for the sake of explanation that the output of the charge pump generator, node 233, is at its lowest potential, and also at the beginning of the period designated as $T_1$ in FIG. 6. At this point in time the bootstrap circuit 234 bootstraps the gate of transistor 236 and the potential on node 233 begins to rise. The rate of this rise in potential is function of a plurality of RC time constants which are generally identified in FIG. 5 with the arrows $T_1$. Specifically, current flows through transistor 235, resistor 236, transistor 239 and charges capacitor 240. As capacitor 240 charges, transistor 242 begins to conduct and this in turn causes transistor 243 to conduct. The potential at the input to the Schmitt trigger means 247 begins to rise as capacitor 244 is discharged through transistor 246. Note that prior to the $T_1$ period indicated in FIG. 6, transistor 252 was conducting hence capacitor 244 was charged, and at the beginning of the $T_1$ period transistor 252 and transistor 253 are not conducting.

When the potential at the input to the trigger reaches a predetermined level, the trigger circuit is activated thereby changing the status of the latch 257. When this occurs transistors 252 and 253 begin to conduct. Node 233 is discharged through the path indicated as $T_3$ in FIG. 5. This path includes the parasitic capacitance associated with the charge pumps on the cells in the array identified as cell capacitance 259. Through this path the potential charge pump waveform illustrated in FIG. 6 drops to $V_{BB}$.

Through the path identified as $T_2$ the input node to the Schmitt trigger means 247 is discharged through transistor 246 and transistor 252. When the potential on the input node to the Schmitt trigger means 247 sufficiently decreases, the trigger means becomes reset thereby changing the status of the latch 257. This causes transistors 252 and 253 to cease conducting and the cycle begins again.

In one embodiment the frequency for the charge pump signal is between approximately 100 and 300 Khz, with the signal varying between $V_{DD}$ less approximately 1.5 volts and $V_{BB}$ plus a small offset. The decay time associated with $T_3$ is approximately 200 nanoseconds. In the presently preferred embodiment the output of the Schmitt trigger means 247 coupled to the drain of transistor 234 becomes more negative in potential than ground (when in its low state). This assures that transistor 235 does not conduct when node 233 is pulled down to $V_{BB}$ through transistor 253. In this embodiment the output of the charge pump drops to $V_{BB}$.

Thus, a random access memory has been disclosed which is ECL compatible. The memory may be utilized in a similar manner to other random access memories and information is written into and read from the memory utilizing known timing techniques. The memory may be fabricated on a single substrate using known MOS technology.

We claim:

1. A metal-oxide-silicon, random-access memory which is compatible with emitter-coupled logic and which is deployed on a single substrate comprising:
   a plurality of memory cells for storing information;
   a plurality of sensing means for sensing information in said memory cells, coupled to said memory cells;
   a plurality of timing signal generators for generating timing signals coupled to said memory cells and to said sensing means;
   a plurality of input buffers for receiving input signals to said memory, each of said buffers having at least two input terminals, one of said input terminals for receiving a reference signal and the other of said terminals for receiving an input signal, each of said buffers including circuit means for adjusting the sensitivity of said buffer to said input signal as a function of the magnitude of said reference signal;
   whereby said memory will be compatible with external logic circuitry.

2. The memory defined in claim 1 wherein said input buffers include means for receiving both address signals and signals representative of data to be stored in the memory.

3. The memory defined in claim 1 wherein each of said input buffers includes a circuit having a first branch, a second branch and positive feedback means for feeding a signal in said first branch into said second branch and from said second branch into said first branch.

4. The memory defined in claim 3 wherein a first field-effect transistor is disposed in said first branch and wherein the gate of said first transistor is coupled to one of said input terminals for receiving said reference signal and wherein a second field-effect transistor is disposed in said second branch and the gate of said second transistor is coupled to said other input terminal for receiving said input signal.

5. A metal-oxide-silicon, random-access memory which is compatible with emitter-coupled logic and which is deployed on a single substrate comprising:
   a plurality of memory cells for receiving signals;
   a plurality of amplifiers for sensing information in said memory, coupled to said memory cells;
   a first timing generator for receiving an input timing signal and its complement and for generating a first timing signal, said first generator comprising a latched differential amplifier which includes a DC stabilizing loop for controlling DC levels within said amplifier;
   a plurality of memory clock generators for generating a plurality of clock signals, said generators being coupled to said first timing generator; and
   a plurality of input buffers for receiving input signals to said memory coupled to said cells;
   whereby said memory generates a first high level clocking signal based on said input timing signal and said high level clocking signal is utilized by the memory to generate other clocking signals for the memory.

6. The memory defined in claim 5 wherein said DC stabilizing loop includes a second differential amplifier, one input to said second differential amplifier being said first timing signal being a signal representative of the threshold of at least one transistor disposed within said memory.

7. The memory defined in claim 6 wherein said latched differential amplifier includes a first leg and a second leg coupled to a current source.

8. The memory defined in claim 7 wherein the current in said current source is controlled by the output of said second differential amplifier.

9. The memory defined in claim 8 wherein said first leg and second leg of said latched differential amplifier each includes a load transistor and wherein the current in said load transistor is regulated by the output of said second differential amplifier.

10. A random-access memory deployed on a single silicon substrate comprising:
   a plurality of parallel row lines;
   a plurality of first parallel column lines transverse to said row lines;
   a plurality of second parallel column lines, spaced apart from said first column lines, said second column lines being parallel to said first column lines and transverse to said row lines;
   a first plurality of memory cells for storing information, each of said row lines being coupled to at least one of said first plurality of memory cells, said first plurality of memory cells being coupled to said first column lines;
   a second plurality of memory cells for storing information, said second plurality of memory cells being spaced apart from said first plurality of memory cells, each of said row lines being coupled to at least one of said second plurality of memory cells, said second plurality of memory cells being coupled to said second column lines;
   a plurality of column amplifiers, one of said amplifiers being coupled to one of said column lines such that each of said first and second column lines are coupled to one of said amplifiers;
   a bidirectional input-output line coupled to each of said column amplifiers;
   a sense amplifier coupled to said bidirectional data line for sensing information stored in said cells; and
   at least one data input line coupled to said bidirectional data bus line for writing information into said cells;
   whereby a single bidirectional data bus line is utilized to write information into the cells and to read information from said cells.

11. The memory defined in claim 10 wherein a plurality of decoders are disposed between said first plurality and second plurality of memory cells.

12. The memory defined in claim 10 wherein each of said first and second column lines includes a pair of lines and wherein each pair of lines terminates in a single one of said plurality of column amplifiers.

13. The memory defined in claim 12 including means for selectively charging said column lines and said bidirectional data bus line.

14. A decoding system for a memory for decoding an address, which address includes a first part and a second part, said memory including at least a first group of memory cells and a second group of memory cells comprising:
   at least two second level decoding means for decoding said second part of said address, one of said second level decoding means being coupled to said first group of memory cells, the other of said second level decoding means being coupled to said second group of memory cells; and
   a first level decoding means for decoding said first part of said address and for selecting one of said first group or second group of memory cells, coupled to said second level decoding circuits;
   whereby said first level decoding means selects one of said first or second groups of memory cells and said second level decoding circuits selects a memory cell within the selected group.

15. The decoding system defined by claim 14 wherein said first level and second level decoding means are utilized for selecting both row lines and column lines in a randomaccess memory.

16. The memory defined in claim 15 wherein each of said first level and second level decoding means each comprise a gate and wherein the output of said first level decoding means are utilized to activate said second level decoding means.

* * * * *